United States Patent
Kasai et al.

(10) Patent No.: US 7,939,801 B2
(45) Date of Patent: May 10, 2011

(54) ELECTRON BEAM OBSERVATION DEVICE USING PRE-SPECIMEN MAGNETIC FIELD AS IMAGE-FORMING LENS AND SPECIMEN OBSERVATION METHOD

(75) Inventors: Hiroto Kasai, Higashimatsuyama (JP); Ken Harada, Fuchu (JP)

(73) Assignee: HItachi, Ltd., Tokyo (JP)

( * ) Notice: Subject to any disclaimer, the term of this patent is extended or adjusted under 35 U.S.C. 154(b) by 351 days.

(21) Appl. No.: 12/270,422

(22) Filed: Nov. 13, 2008

(65) Prior Publication Data

US 2009/0206258 A1    Aug. 20, 2009

(30) Foreign Application Priority Data

Feb. 15, 2008 (JP) .................................. 2008-033945

(51) Int. Cl.
*H01J 37/26* (2006.01)
(52) U.S. Cl. .. 250/311; 250/307; 250/310; 250/396 ML
(58) Field of Classification Search .................. 250/306, 250/307, 310, 311, 396 R, 396 ML, 398
See application file for complete search history.

(56) References Cited

U.S. PATENT DOCUMENTS

| | | | | |
|---|---|---|---|---|
| 3,327,112 A * | 6/1967 | Hiroshi | .......................... | 250/311 |
| 3,509,335 A * | 4/1970 | Nixon | .......................... | 250/311 |
| 3,872,305 A * | 3/1975 | Koike | .......................... | 250/311 |
| 4,458,151 A * | 7/1984 | Koike et al. | .................. | 250/310 |
| 2007/0176103 A1 | 8/2007 | Inada et al. | | |

FOREIGN PATENT DOCUMENTS

| | | |
|---|---|---|
| EP | 1 274 114 A2 | 1/2003 |
| JP | 06-283128 | 10/1994 |
| JP | 8-227681 A | 9/1996 |
| JP | 2005-032588 | 2/2005 |

OTHER PUBLICATIONS

Journal of Applied Physics, vol. 30, No. 5, May 1959.
T. Hirayama, et al., Appl. Phys. Lett. 63(3), Jul. 19, 1993.

* cited by examiner

*Primary Examiner* — Jack I Berman
(74) *Attorney, Agent, or Firm* — Mattingly & Malur, P.C.

(57) ABSTRACT

An electron beam observation device includes a mechanism which disposes a specimen at an upstream side in an electron beam traveling direction outside an objective lens, from which an image is transferred under a magnification of ⅕ to 1/30, in addition to an inside of the objective lens in which a specimen is disposed at a time of ordinary observation.

18 Claims, 17 Drawing Sheets

ELECTRON BEAM OBSERVATION DEVICE USING PRE-SPECIMEN MAGNETIC FIELD AS IMAGE-FORMING LENS AND SPECIMEN OBSERVATION METHOD

BACKGROUND OF THE INVENTION

The present invention relates to a device for observing an image of a specimen by using an electron beam and an image observation method using the same, and more specifically, the present invention uses a magnetic field at an upstream side in an electron beam traveling direction from the specimen to form the specimen image even in magnetic fields generated in an objective lens.

Lenses used in electron beam devices include two types: one produces a lens effect by an electric field, and the other produces the similar effect by a magnetic field. In the case of electron microscopes available as commercial products at present, most of them are of the latter type, and are called electromagnetic lenses. Of the electromagnetic lenses which are incorporated in these electron beam devices, the objective lenses of a transmission electron microscope TEM and a scanning type electron microscope are important elements which determine the performance of the devices.

FIG. 1 schematically shows a configuration of an ordinary magnetic field type objective lens. Main components comprise a magnetic pole piece 1, a coil 3 and a magnetic path 4. An amount of spherical aberration which mainly restricts the performance of a lens (=spatial resolution) becomes larger in proportion to a focal length. Therefore, at the time of actual use, an exciting current of the coil 3 is made large to generate a magnetic field at a level of a saturation magnetic field of a material constituting a magnetic yoke 4 and the magnetic pole piece 1, and the lens is used under the condition of a short focal length. At that time, in order to reduce aberration of the lens at a downstream side (here, the upper side of the paper surface is set as an upstream side, and the lower side is set as the downstream side) from the objective lens, it is general to make the magnification of the image formed by the objective about 100 times. In order to realize this, a distance between the objective lens and an object surface needs to be made about the focal length, and therefore, a specimen 2 needs to be placed in a magnetic field between the opposed magnetic pole pieces 1. It is a post-specimen magnetic field of the magnetic fields formed between both the magnetic pole pieces that contributes to image formation, and the specimen is observed in a state in which it is immersed in the magnetic field.

Pre-specimen magnetic fields are used for forming a very small electron spot in a scanning transmission electron microscope (STEM) (reduction projection of a crossover image on a specimen), for forming a convergent electron beam at a large angle in convergent beam electron diffraction (CBED), for miniaturization of an analysis region in analysis methods such as electron dispersive X-ray spectroscopy (EDS) and electron energy loss spectroscopy (EELS), and for implementing collimated illumination in a TEM. As one example of these conventional arts, a geometrical-optical system diagram in the case of forming collimated illumination is shown in FIG. 18 by clearly drawing a lens generated by a pre-specimen objective lens field as an independent pre-specimen field lens 10. In FIG. 18, electron beams which incident on a condenser lens 5 form a crossover spot 6 on a focal surface at a front side of the pre-specimen field lens 10 by the condenser lens 5. Under this condition, electron beams at a rear side (downstream in an electron beam traveling direction) from the pre-specimen field lens 10 acts to form a crossover spot on the position of infinity from the pre-specimen field lens 10, and therefore, become collimated illumination as a result. Making collimated illumination possible in a wide range is very advantageous from the aspect of high resolution observation from the viewpoint of causing more detailed information to contribute to image formation.

As is apparent from these using methods, it is technology status that the pre-specimen magnetic field remains to be considered as a part of the illumination optical system located at the upstream side of the specimen in the traveling direction of the electron beams.

Such using methods of the electromagnetic lenses have the above described advantage, but have the following problems.

(1) A TEM has spatial resolution of an atomic order, and therefore, spatial measurement with high accuracy of a sub-nano meter order is possible by observation of a crystal lattice image. However, in an intermediate magnification region of about several tens thousand to a hundred thousand times, reproduction of the electronic optical system is insufficient due to hysteresis of the magnetic lens, and there is no standard specimens which are suitable for calibration of the magnification range and produced in volume at low cost. Therefore, with the specimen of which spatial size is not known, size measurement accuracy is insufficient.

(2) Further, while the magnifying power of the objective lens becomes high, and the magnifying power of several tens to a million times become easy as all the electron microscopes, realization of the magnifying power of the transitional range (×200 to 2000) between an optical microscope and an electron microscope becomes difficult. In order to realize the above described condition, there is no other measure than to suppress the magnifying power of the lens at the downstream side from the objective lens in the traveling direction of an electron beam, or to use lenses in combination so as to become a reduction system (lens power <1), and use in the state of large influence of image distortion and aberration is forced. Further, such conditions are significantly different in the use conditions of the lens from the above described high magnification observation. Therefore, it is often difficult to match the axes of all the lens with one another, and a special technique is required for adjustment of the electron optical system at the time of observation.

(3) Further, the specimen is placed in the magnetic field, and therefore, influence on the specimen by the magnetic field is not avoided when the specimen is a magnetic substance. In order to prevent the influence, there have been conventionally adopted the measures in which an image is formed with the lens at the downstream side from the objective lens without using the objective lens. The method does not require modification of the device side, and therefore, has been used for observation of a magnetic substance by a TEM for a long time, but with an extremely long focus and reduction in power of the lens which carries out image formation, reduction in the spatial resolution of the final observation image cannot be avoided (M. E. Hale, H. W. Fuller, and H. Rubinstein,; Journal of Applied Physics, vol. 30, p 789, 1959).

Further, there are proposed the measure in which the specimen position is moved to a distant position at the upstream side in the electron beam traveling direction from the magnetic yoke of the objective lens, and a magnetic shield is provided around the specimen (JP-A-06-283128). JP-A-06-283128 is accompanied by addition of a port for inserting a new specimen holding device to the device body, but is effective in not only the aspect of reducing the influence of the magnetic field received by the specimen, but also in the aspect of suppressing the magnifying power of the objective lens described in the previous paragraph by the movement of the specimen position. However, JP-A-06-283128 does not clearly describe the concrete moving amount of the specimen position and change in magnification accompanying the movement. Other than this, the techniques of JP-A-2005-32588 and "T. Hirayama, Q. Ru, T. Tanji, A. Tonomura,; Applied Physics Letters, vol. 63, p 418, 1993" in which a magnetic pole piece in a special shape which reduces the magnetic field around the specimen is incorporated can provide the effect of receiving no influence of the magnetic fields. However, in each of these countermeasures, a magnetic pole piece in a special shape corresponding to an observation target needs to be newly produced and replaced with the conventional magnetic pole piece.

SUMMARY OF THE INVENTION

The objective lens of a TEM is physically one lens, but functions as if it were a plurality of lenses, in accordance with the magnitude of the magnetic field formed in the magnetic pole. In the present invention, by using this characteristic, two specimens disposed at different positions, or normal focus images of the respective specimens are simultaneously observed without significantly changing the ordinary objective lens condition. The details of the theory of the image formation principle of the objective lens will be described hereinafter.

The paraxial trajectory equation of the electron beams in the axisymmetric magnetic field is expressed as formula 2 when the magnetic field $B_z(z)$ formed in the magnetic pole in the objective lens is approximated to a bell-shaped distribution in accordance with formula 1. Further, formula 2 can be expressed as formula 5 when it is simplified by using a lens constant $k^2$ expressed by formula 3, and formula 4.

$$B_z(z) = \frac{B_0}{1+\left(\frac{z}{d_{Bell}}\right)^2} \quad \text{(Formula 1)}$$

Where, z represents the coordinate of an optical axis with the specimen position set as the origin, $B_0$ represents the maximum value, and $d_{Bell}$ represents the half width of magnetic field distribution. When z=0, the maximum magnetic field strength is obtained.

$$\frac{d^2 r}{dz^2} + \frac{eB_z^2(z)}{8mV}r = 0 \quad \text{(Formula 2)}$$

Where, r represents the radial distance from the optical axis, z represents the coordinate of the optical axis with the specimen position as the origin, e and m respectively represent the charge and the mass of an electron, and V represents the potential (acceleration voltage) applied to the electron beam.

$$k^2 = \frac{eB_m^2 a^2}{8mV} \quad \text{(Formula 3)}$$

$$\omega^2 = 1 + k^2 \quad \text{(Formula 4)}$$

$$\frac{r}{r_0} = \frac{\sin(\omega\varphi)}{\omega\sin(\varphi)} \quad \text{(Formula 5)}$$

Where, $r_0$ represents the radial distance from the optical axis at the incident position on the magnetic field, and the boundary condition of $\varphi=0$ at $z=\infty$ is used.

FIG. 2A is the calculation result showing the magnetic field distribution based on formula 1 by the broken line, whereas FIG. 2B is the calculation result showing the trajectory of the electron beam based on formula 5 by the solid line. In each of FIGS. 2A and 2B, the axis of abscissa represents the distance on the optical axis standardized by the half width $d_{Bell}$ of the magnetic field distribution, and the axis of ordinates of FIG. 2A represents the magnetic field standardized by the maximum value $B_0$ of the magnetic field, and the axis of ordinates of FIG. 2B represents the numerical value standardized by the radial distance $r_0$ from the optical axis at the incident position on the magnetic field.

FIG. 2B shows that when the magnetic field strength is zero ($k^2=0$) the electron beams travel in straight lines, but as $k^2$ becomes larger, the electron trajectory intersects the optical axis, and when $k^2=3$, the electron trajectory becomes a confocal optical system which intersects the optical axis at the symmetric position (center position) of the magnetic field distribution, and thereafter, exits from the magnetic field region in parallel with the optical axis. These special condition occur when $\omega^2=1, 2, 3 \ldots$, that is, $k^2=0, 3, 8, 15 \ldots$.

FIGS. 3A, 3B and 3C schematically show the states in the case of $k^2=3, 8,$ and 15 of the above by using six kinds of lenses with the focal lengths of $f_1$ to $f_6$. When the magnetic field strength of $k^2=3$ (FIG. 3A) is adopted and the specimen is disposed at the center of the lens magnetic field, if irradiation is performed with electron beams parallel with the optical axis, the irradiation condition for STEM or CBED in which the electron beams form a crossover spot at the specimen position can be obtained, and if irradiation is performed under the condition in which the electron beams form the crossover spot at the focal position at the front side from the upstream side lens, collimated illumination in which the incident electron beams on the specimen become parallel with the optical axis is achieved.

When the electron beams parallel with the optical axis are incident as described above, the incident electron beams form crossover spots twice when $k^2=8$ (FIG. 3B) and three times when $k^2=15$ (FIG. 3C) until the incident electron beams exit outside the lens magnetic field. As is appreciated from this, the objective lens functions as if it were a plurality of lenses in accordance with the magnitude of the magnetic field formed in the magnetic pole though it is physically one lens.

When the present invention is applied, the normal focus images of the two specimens disposed at different positions can be simultaneously observed without significantly changing the objective lens conditions of an ordinary TEM. By applying this characteristic, a substance having a structure of which spatial size is known is used for one of the specimens, and by observing both the specimens, measurement of the size of the specimen by using a TEM becomes possible.

Further, by disposing one of the specimens at the upstream side from the objective lens, the reduction optical system can be formed in the objective lens when the specimen is observed, and the effective magnifying power of the objective lens can be suppressed to be low. Thereby, observation under a low magnification which has been difficult to realize conventionally can be made possible without significantly changing the lens conditions, and therefore, the condition of the transitional magnifying power of the optical microscope and the electron microscope can be easily realized.

Further, when one of the specimen positions is at the upstream side in the electron traveling direction and outside the magnetic yoke of the objective lens, the influence from the magnetic field of the objective lens can be avoided, and the present invention can be applied to observation of magnetic specimens. Further, in this case, the observation device can be released from the spatial restriction such as a magnetic pole piece and a coil, and therefore, a solid angle for incorporation of a detector for capturing X-ray fluorescence or secondary electrons can be taken to be large. Further, various environments for application of an electric field and a magnetic field to the specimen, cooling and heating, inclination and rotation, compression and tension and the like can be created, and the observation device can be provided to a wide range of application experiments.

Other objects, features and advantages of the invention will become apparent from the following description of the embodiments of the invention taken in conjunction with the accompanying drawings.

DETAILED DESCRIPTION OF THE INVENTION

Embodiment 1

Figure 4:
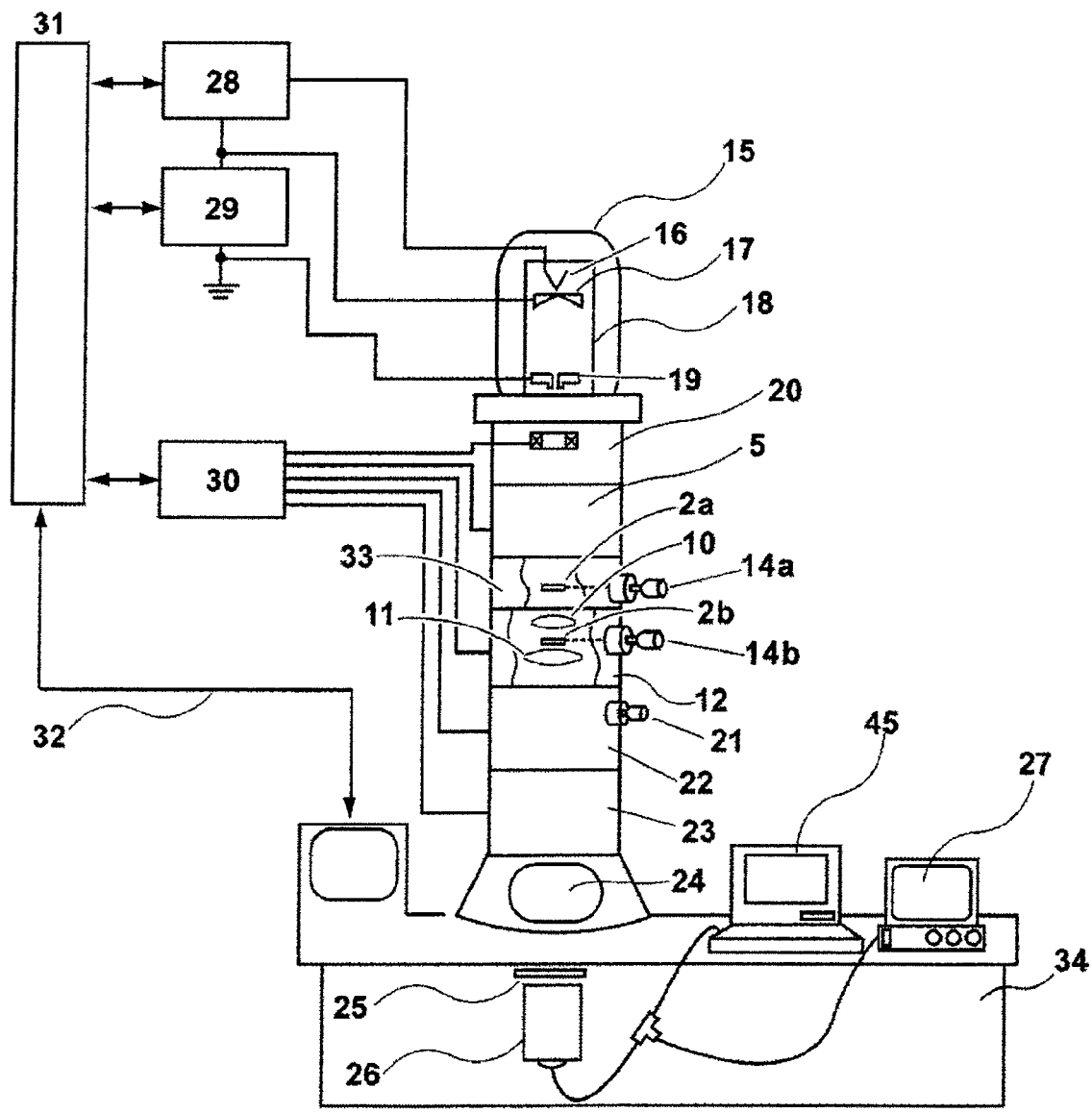
FIG. 4 is a diagram showing a basic configuration of an embodiment 1.

FIG. 4 schematically shows disposition of a TEM to which the present invention is applied. An electron gun 15 comprises an electron source 16 constituted of tungsten needle single crystal with a tip end sharpened, a lead-out electrode 17 placed at a position opposed thereto, a ground electrode 19 and an accelerating tube 18 for accelerating electrons which are led out. High voltage can be applied to the lead-out electrode 17 by a lead-out power supply 28 provided outside, and the lead-out electrode 17 can lead out electrons by application of voltage of about −3.0 to −2.5 kV between the electron source 16 and the lead-out electrode 17. Accelerating voltage for accelerating the electrons which are led out is supplied to the accelerating tube 18 by an accelerating voltage power supply 29. The electron beams emitted from the electron gun 15 are set at a desired irradiation condition in an intermediate chamber 20 including an alignment coil and a condenser lens 5, and are irradiated to any one or both of specimens A 2a and B 2b which are placed on a tip end of any one or on tip ends of both of specimen holders (specimen holding devices) 14a and 14b. These specimen holders 14a and 14b are preferable to include functions of inserting the electron beams into the optical axis and mechanisms capable of moving within a plane perpendicular to the optical axis. As far as the specimen holder 14a is concerned, however, when it has a stop for suppressing upward scattering of secondary electrons which are generated by electron beam irradiation to the specimen already provided, a product on which the specimen can be mounted may be attached to a tip end of the diaphragm insertion shaft, and may be used as the specimen holder (specimen holding device) and the diaphragm.

The details of the image formation process in an objective lens 12 will be described later.

An intermediate lens 22 and a projection lens 23 which are located at a downstream side in an electron beam traveling direction from the objective lens 12 are used for sequentially magnifying the image on a surface of a selected area diaphragm 21. All these electromagnetic lenses are supplied with an electric current by a lens power supply 30. Further, the lens power supply 30 is connected to a control part 31, and the control part 31 executes a command signal 32 from an operator and always controls output. Finally, the operator observes the image magnified by the above described optical system directly from an observation window 24 or the image photographed by a television camera 26 via a television monitor 27. Here, instead of the television camera 26, a CCD camera with high accuracy may be used. Output signals of these videos are also input into an image processing PC 45, and calculation processing of the images can be performed in real time. The image to be observed can be recorded by using a photograph film 25. The above description is about an electron microscope main body 34 which is the basis.

The magnetic field generated in gaps of magnetic pole pieces (not shown) inside the objective lens 12 significantly depends on the material constituting a magnetic yoke of the objective lens 12. In the present conditions, the value is about 2[T], which corresponds to $k^2<3$. Since the condition of $k^2<3$ does not reach $k^2=3$, the objective lens is not the lenses with the focal lengths equal to each other (confocal condition) shown in FIG. 3A, but behaves as if two lenses with different focal lengths existed. In the following, these two lenses constituting the objective lens are illustrated such that the lens at the upstream side in the electron traveling direction is as a pre-specimen field lens 10 (Pre-Specimen Field Lens: hereinafter, PRE), and the lens at the downstream side is as a post-specimen field lens 11 (Post-Specimen Field Lens: hereinafter, PST).

Figure 5:
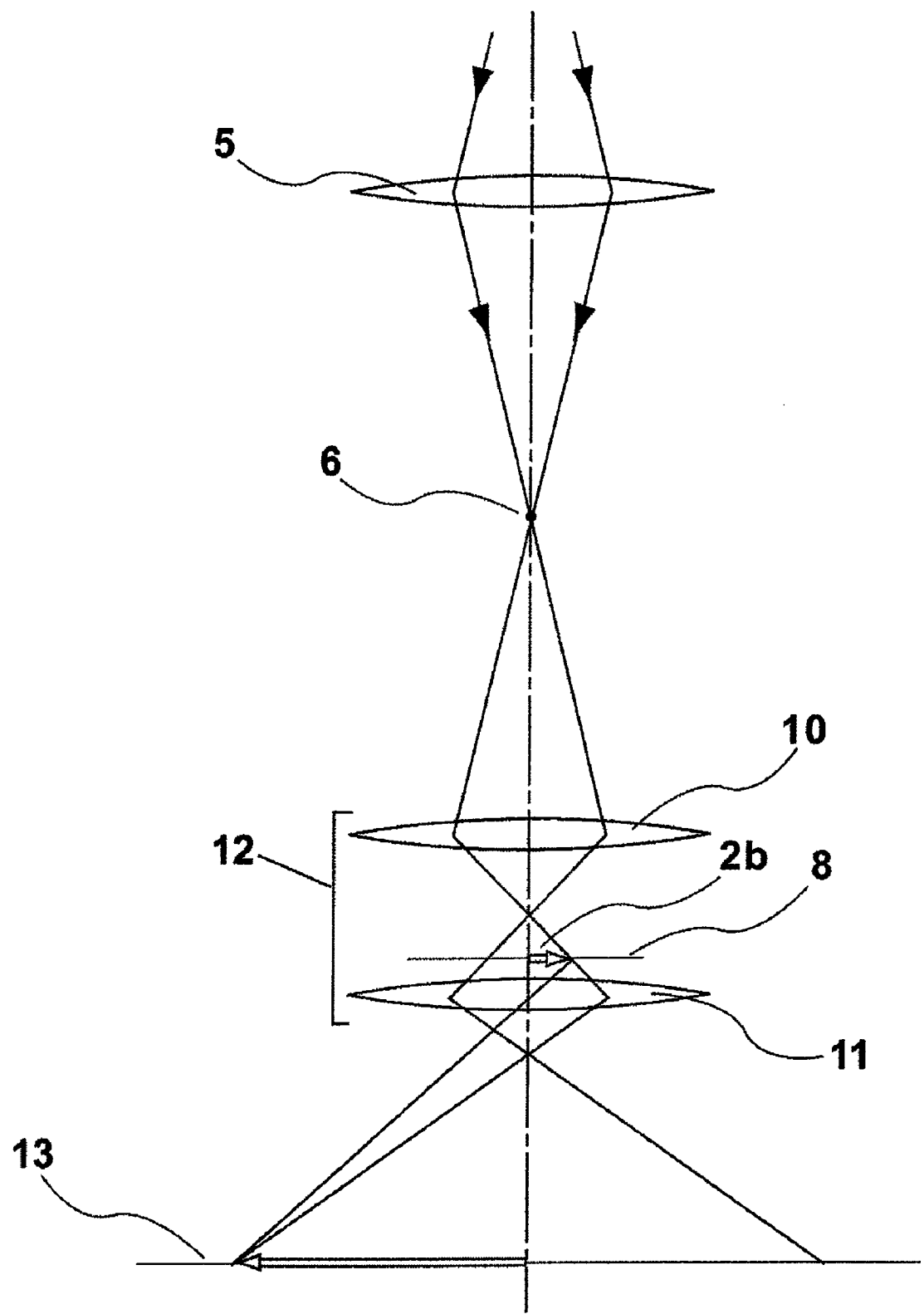
FIG. 5 is a geometrical-optical diagram for explaining an image formation process of a specimen B in the case of $k^2<3$.

First, an example of the most typical use of the objective lens 12 will be described by using FIG. 5. FIG. 5 shows the process of forming an image of the specimen B 2b mounted on the specimen holder 14b.

The electron beams incident on the condenser lens 5 form a crossover spot 6 once behind the lens 5, and irradiate the specimen B 2b. The scattering and transmitted electron beams which propagate rearward from the specimen B 2b form an image on a screen 13 which is an image surface by the PST 11. In the case of an ordinary electron microscope, the position of the screen 13 is designed to be equal to an SA (selected area) diaphragm surface.

Figure 6:
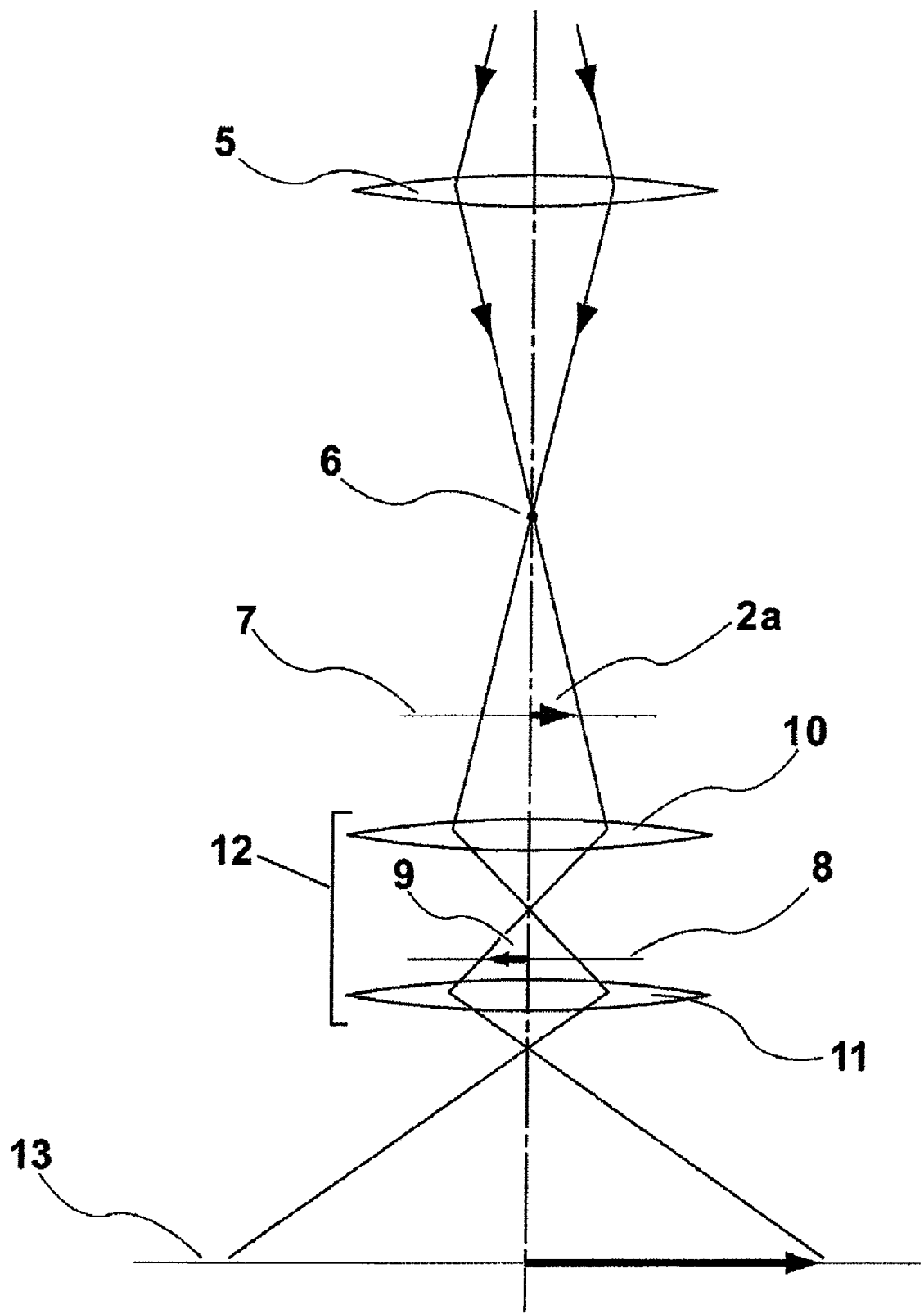
FIG. 6 is a geometrical-optical diagram for explaining an image formation process of the specimen A in the case of $k^2<3$.

FIG. 6 shows an image formation process in the case with only the specimen A 2a mounted on the specimen holder 14a. At this time, an exciting current of the objective lens 12 keeps the state in which the above described specimen B 2b image is formed on the screen 13. Similarly to FIG. 5, the electron beams incident on the condenser lens 5 form the crossover spot 6 behind the lens 5 once, and irradiate the specimen A 2a. The scattering and transmitted electron beams propagating rearward from the specimen A 2a form a transfer image 9 on a surface 8 of the mounting position of the specimen B 2b by the PRE 10 first.

At this time, the relationship of a focal length $f_{PRE}$ of the PRE 10, a distance $a_{PRE}$ from the specimen A 2a to the principle plane of the PRE 10, and a distance $b_{PRE}$ from the principle plane of the PRE 10 to the image surface 9 of the specimen A 2a is such that the formula (formula 6) of the lens is established.

$$\frac{1}{f_{PRE}} = \frac{1}{a_{PRE}} + \frac{1}{b_{PRE}} \qquad \text{(Formula 6)}$$

A transfer magnification of the transfer image 9 depends on the disposition of the PRE 10 and the specimen A 2a, but in consideration of size measurement, low magnification observation and observation of a magnetic material which will be described later, about 1/30 to 1/5 are preferable. The focal length $f_{PRE}$ of the PRE 10 is considered to be larger than the focal length $f_{PST}$ of the PST 11 from the condition of $k^2<3$, but the difference between them is actually small, and it may be considered to be about the same as $f_{PST}$ (to 2 mm). Specifically, when $a_{PRE}$ is set at 10 to 60 mm which is 5 to 30 times as long as $f_{PST}$, or about 10 to 60 mm, the transfer magnification 1/30 to 1/5 of the transfer image 9 is realized. Specifically, the above described magnification is realized by adjusting the specimen mounting surface and the magnetic field strength of the objective lens which generates the PRE 10 so that the distance from the specimen mounting surface of the specimen A 2a and the principle plane of the PRE 10 becomes 10 to 60 mm.

Figure 1:
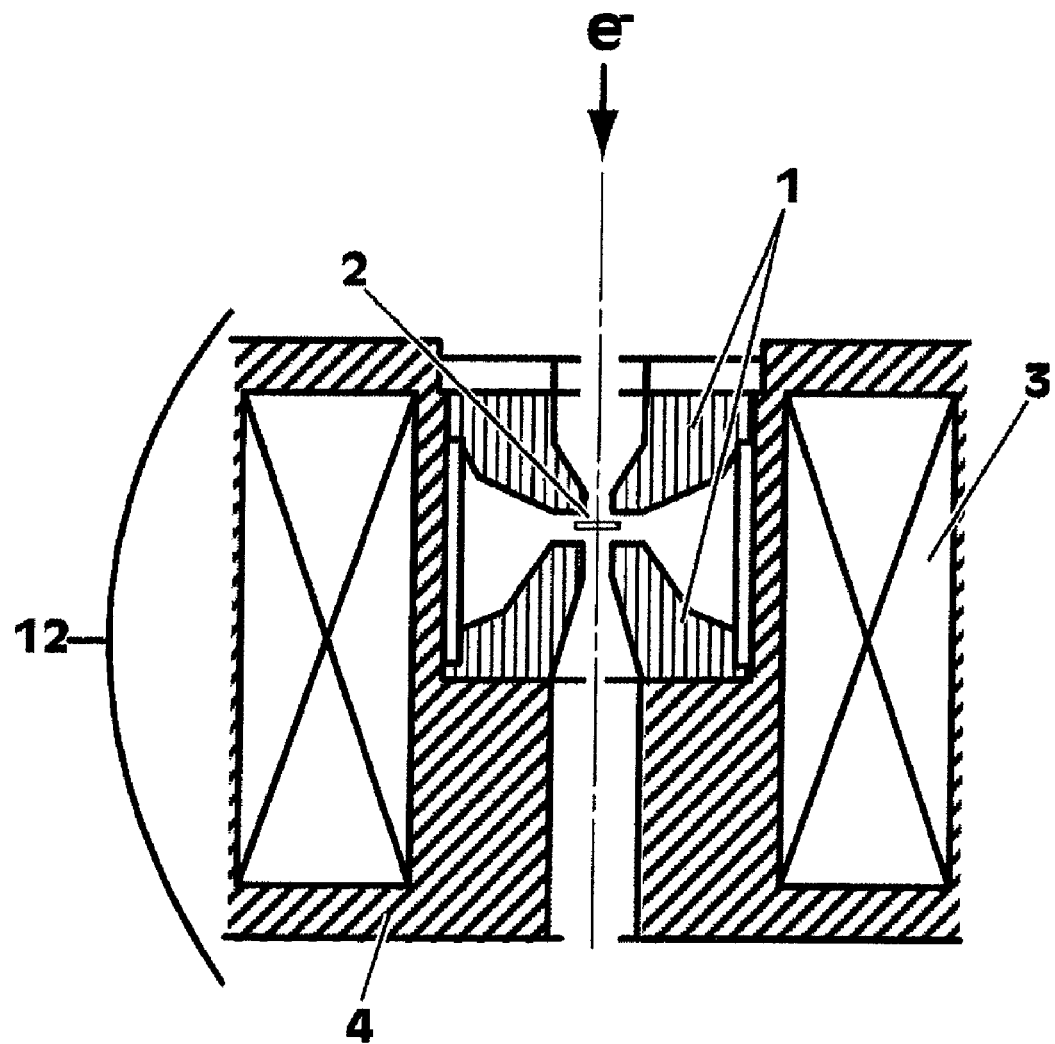
FIG. 1 is a schematic view of a magnetic field type objective lens.
Figure 2A:
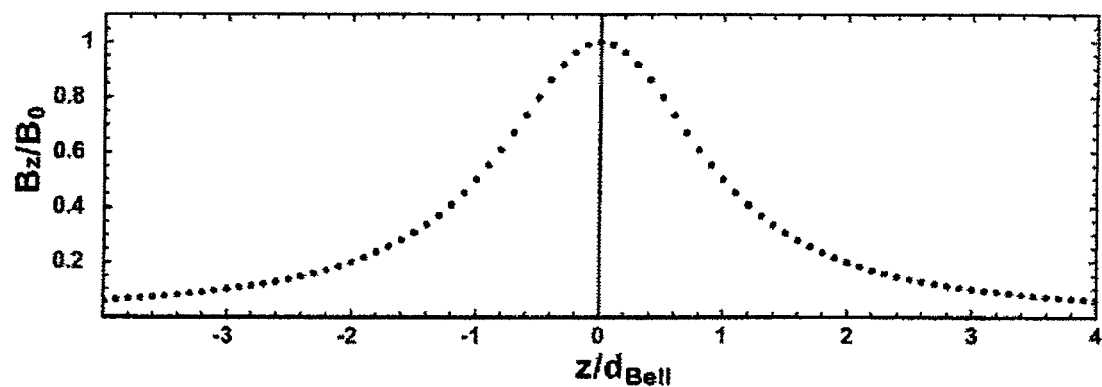
FIGS. 2A and 2B show calculation results of magnetic field distribution formed in the objective lens (FIG. 2A) and an electron beam trajectory (FIG. 2B)
Figure 2B:
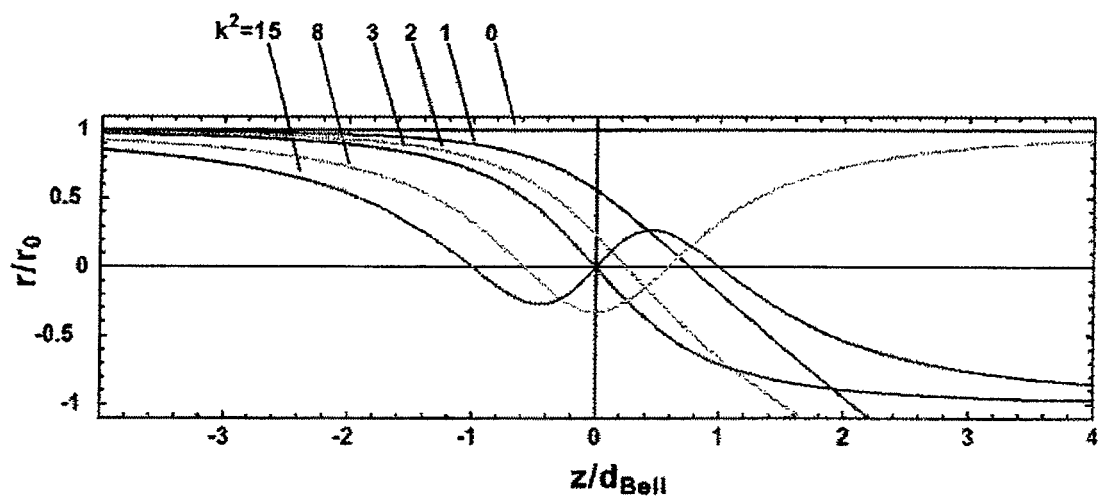
Figure 3A:
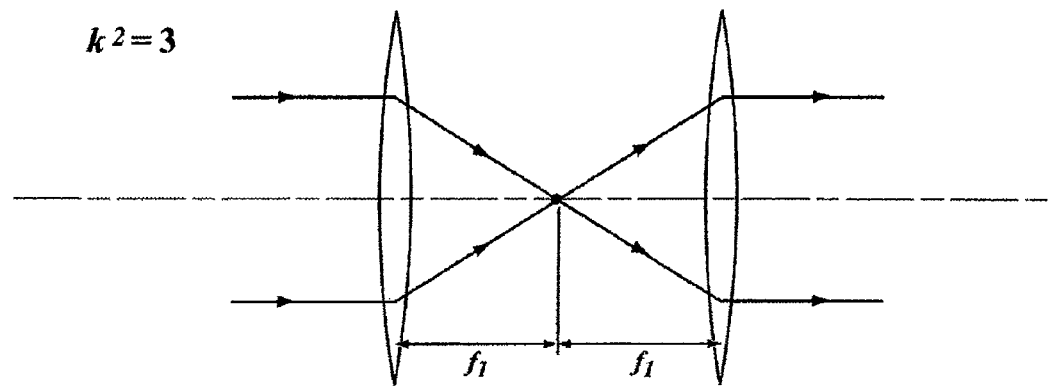
FIGS. 3A to 3C are geometrical-optical diagrams in the cases of $k^2=3$, 8 and 15.
Figure 7:
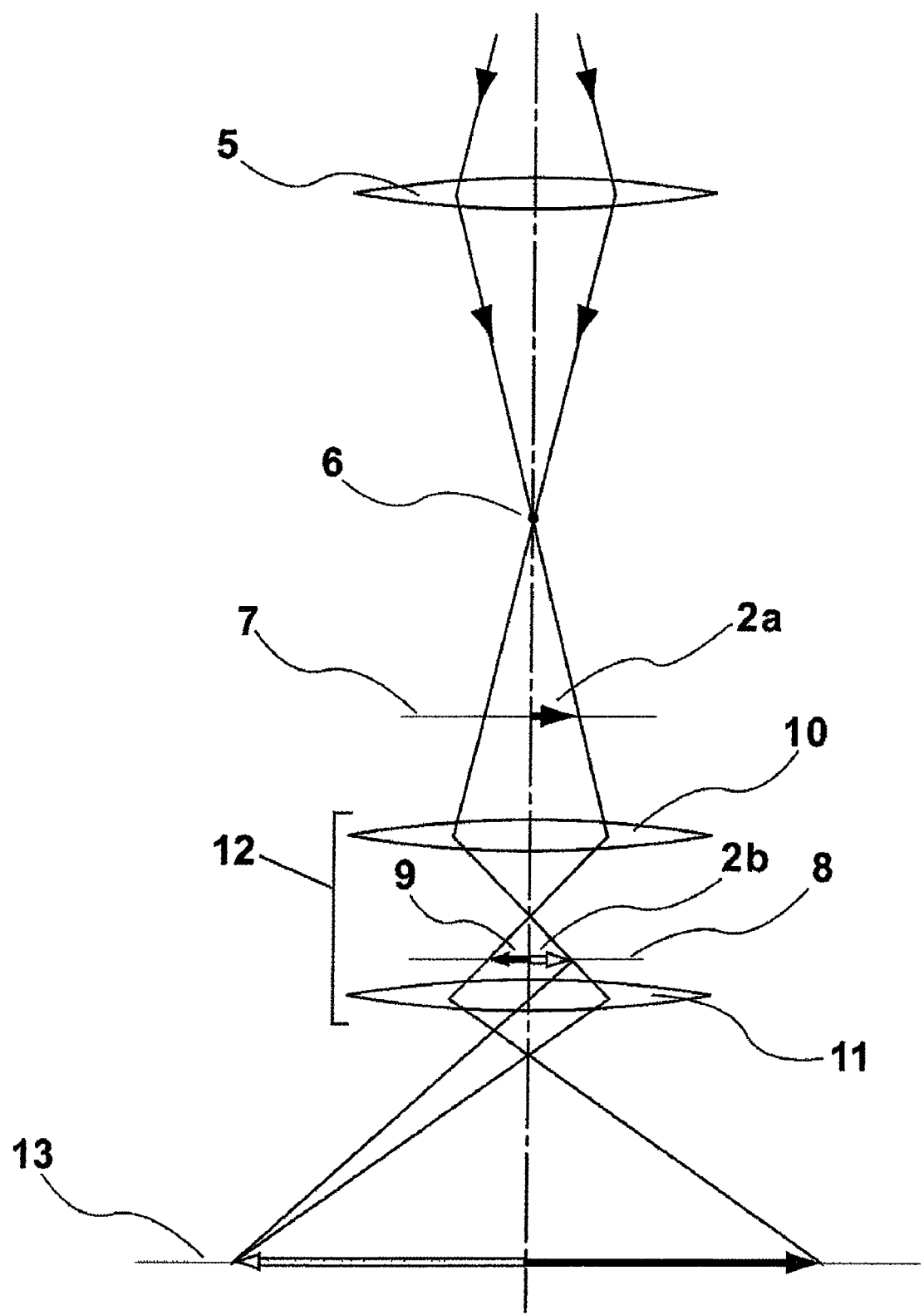
FIG. 7 is a geometrical-optical diagram for explaining image formation processes of the specimen A and the specimen B in the case of $k^2<3$.
Figure 8:
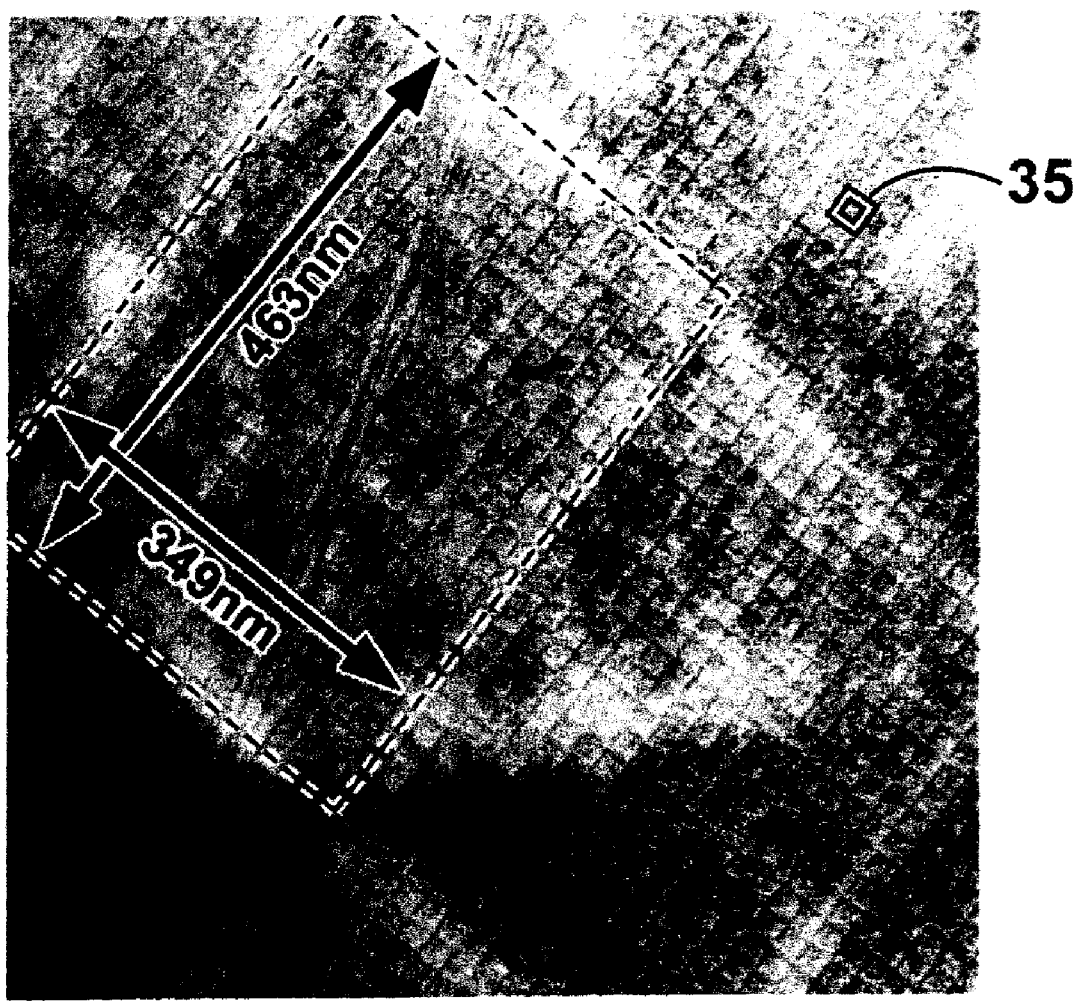
FIG. 8 is an example of the experimental result in which the present invention is applied to size measurement.

FIG. 7 shows the case of placing the specimen A 2a and the specimen B 2b on the respective mounting positions 8 and 9 with the above-described image formation condition unchanged. In this case, the normal focus images of both the specimen A 2a and the specimen B 2b are transferred onto the screen 13. Specifically, though the objective lens is physically one electromagnetic lens, but it becomes an electron optical system capable of forming images for the two specimens placed on the different positions. FIG. 3A is a schematic diagram of the geometrical-optical system in the case of $K^2=3$, and it is not obvious that the images of both the specimen A 2a and the specimen B 2b come into a normal focus. Thus, the result of the verification experiment is shown in FIG. 8. Tetragonal lattice carbon gratings at pitches of 463 nm are used for both the specimens A 2a and B 2b. An image of the specimen B 2b image with a large magnification (enclosed by the Dashed-Line) which is superimposed as well as a tetragonal lattice image 35 at the pitch of 463 nm is observed. The image of the specimen B 2b in the drawing becomes a slightly distorted image with the short side/long side being 349/463 nm, and this is because the specimen B is inclined by about 49° with respect to the optical axis. The specimen inclination has nothing to do with the present invention. By the experimental result, it has been confirmed that the images of both the specimen A 2a and the specimen B 2b can be simultaneously observed.

Figure 9:
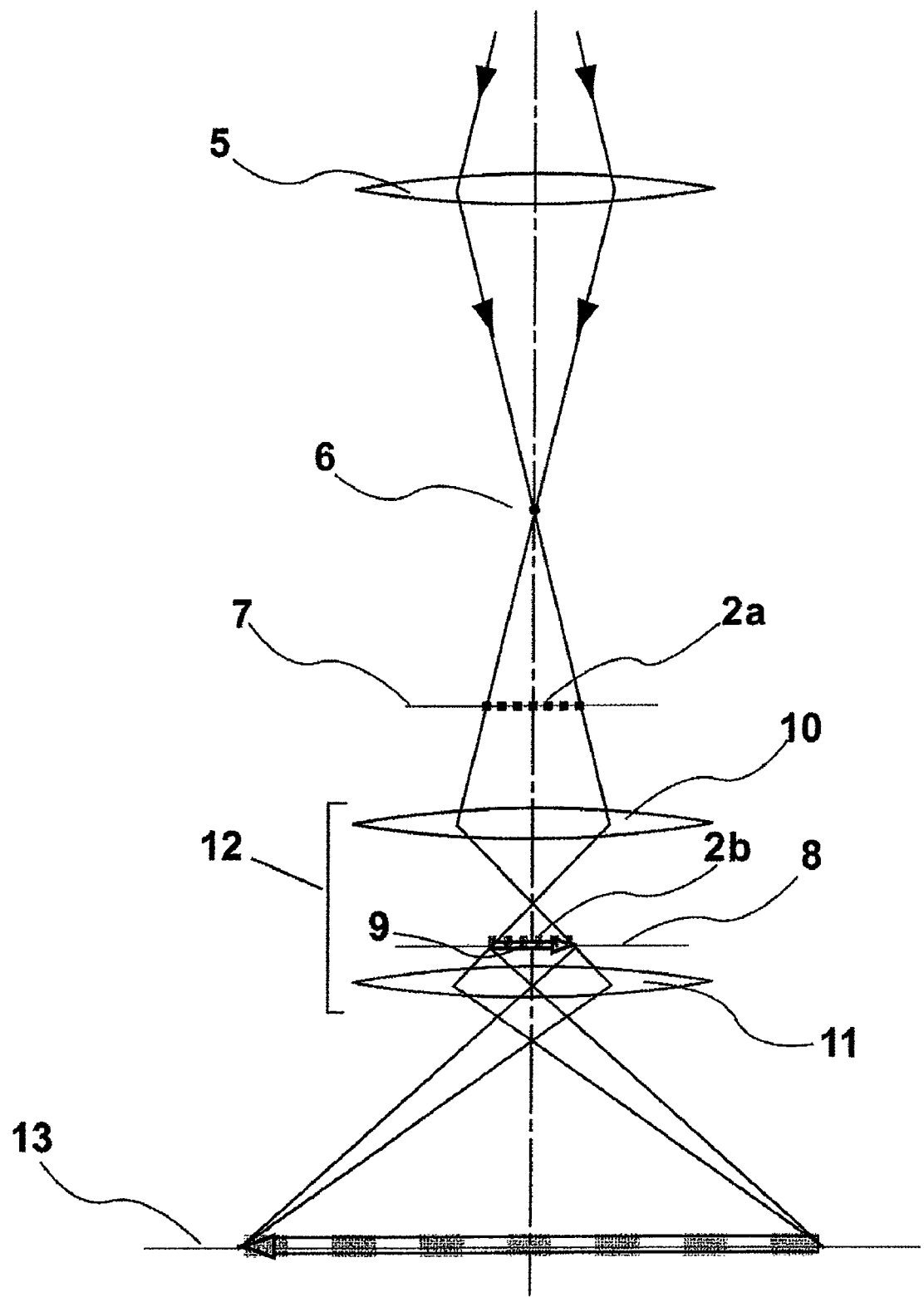
FIG. 9 is a geometrical-optical diagram for explaining an example of application of the present invention to size measurement.

FIG. 9 shows the image formation process of an example of applying the present invention to size measurement of the specimen B 2b by using a substance of which spatial size (width of the pattern) or periodical structure is already known, as the specimen A 2a of FIG. 7. In FIG. 9, the specimen A 2a is shown by the broken line. The image 9 of the specimen A 2a is transferred onto the specimen B 2b by the PRE 10, and two superimposed images of the specimen A 2a and the specimen B 2b are formed on the screen 13 by the PST 11. If the transfer magnification of the specimen A 2a on the screen 13 is measured, by using the image of the specimen A 2a on the screen 13 as a scale, the size of the specimen B 2b can be measured. Further, when the transfer magnification is already known, and a specimen of which spatial size (width of the pattern) or periodical structure is already known is inserted in any one of the mounting positions of two specimens, the mounting position of the specimen of which spatial size is unknown may be any position that is vacant.

This size measuring method does not cause a measurement error due to change in the condition (magnifying power) of the magnifying lens system at the downstream side from the objective lens, because the current value of the objective lens 12 is fixed to the normal focus condition of the specimen, and the position of the screen 13 does not change. Therefore, even when the frequency of the magnification change is high at the time of size measurement, the measurement error caused by the device such as the influence of magnetic hysteresis can be reduced to be low.

Further, from FIG. 8, the measuring method of the transfer magnification when the image of the specimen A 2a is formed on the mounting position 9 of the specimen B 2b can be described. Specifically, both the specimen A 2a and the specimen B 2b are observed by using the carbon grating or the like having a known equidistant periodical structure, and by measuring the relative magnification of the two superimposed specimen images, the transfer magnification can be measured. As long as both the specimens can be observed with the normal focus, the magnifying power of the lens system at the downstream side from the objective lens may be optional. In the case of FIG. 8, the image of the specimen A 2a is formed on the mounting position 8 of the specimen B 2b by a magnification of 1/22. Thereby, the image 35 of the specimen A 2a of FIG. 8 corresponds to the scale of a pitch of 463/22=21 nm on the surface of the specimen B 2b, and the size of the specimen B 2b can be measured by using this.

As the experimental result shown in FIG. 8, when the optical system is set at the reduction optical system such that the transfer magnification of the image of the specimen A 2a onto the surface of the specimen B 2b is reduced, the scale which is originally of a submicron order can be used as a scale of several tens nanometer order having high accuracy. Therefore, when the standard specimen suitable for calibration of such a range is not available at hand, the present embodiment can be also applied.

Here, in order to realize the low magnification observation (×200 to 2000) corresponding to the transitional range of the magnifying powers of optical microscopes and electron microscopes, the magnifying power has been conventionally suppressed to be low by combination of the objective lens and the lens at the downstream side from the objective lens. The reason is that in the case of an ordinary device commercially available, the magnifying power of the objective lens is about 100 times, in addition to which, the projection lens 23 shown in FIG. 4 has a long distance from the fluorescent screen or the image pickup surface of the television camera 26 corresponding to the image surface, and the magnifying power cannot help becoming high. However, the condition which is obtained by such a measure significantly differs from the normal use condition, and the optical axis of the lens of the entire electron microscope deviates. Therefore, the operator is required to have a special skill for correcting this and making adjustment.

Figure 10:
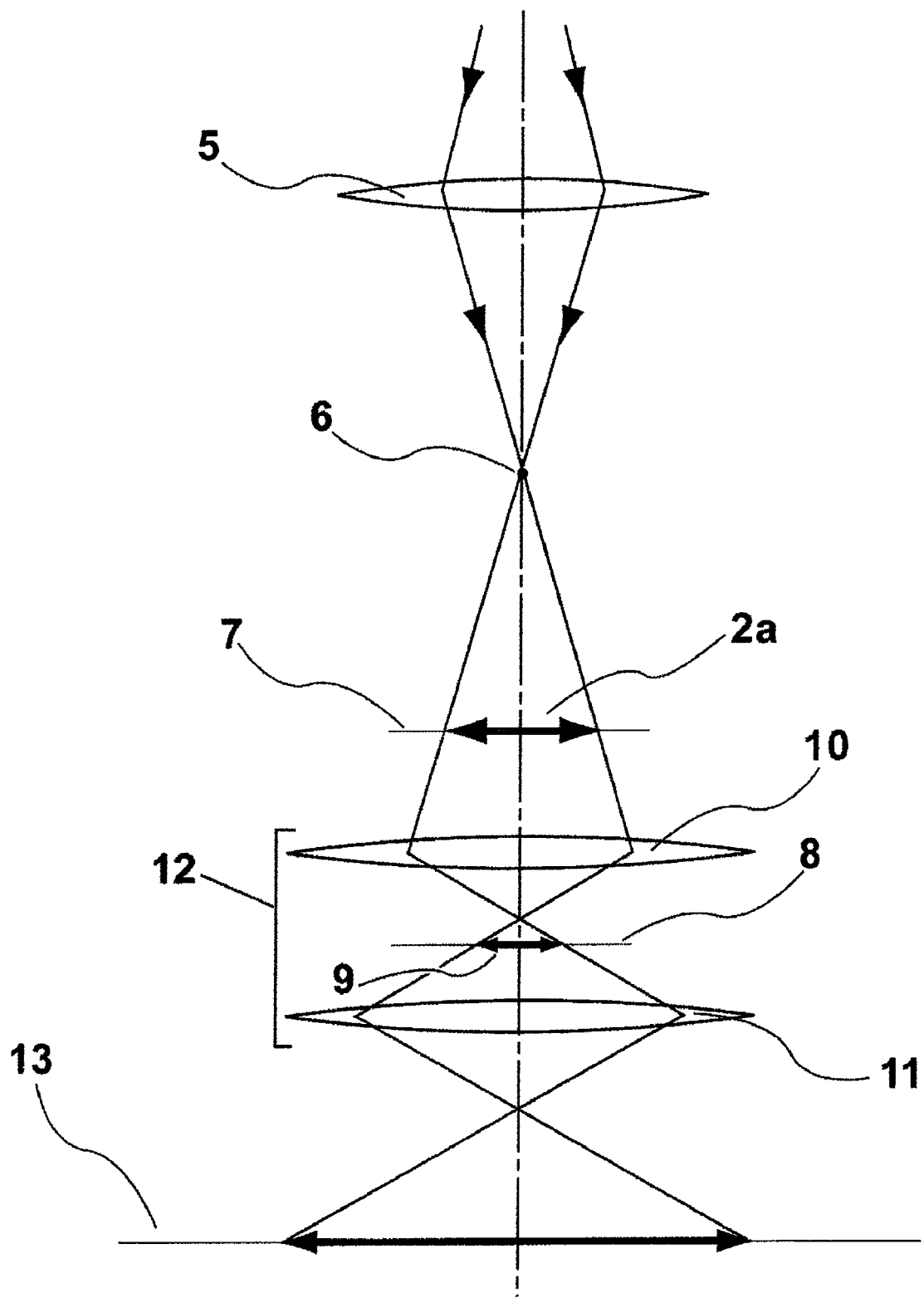
FIG. 10 is a geometrical-optical diagram for explaining an example of a low magnification observation condition to which the present invention is applied.

When any of the specimens is removed from the optical axis in the state of FIG. 7, only the specimen left on the optical axis is observed. FIG. 10 shows an image forming optical system in such a state, and the image of the specimen A 2a of the mounting position 7 is transferred on the surface 8 of the mounting position of the specimen B 2b as the image 9. In this case, the use condition of the objective lens 12 is not different from the ordinary observation condition (the object surface of the PST 11 is the specimen mounting position 8), in addition to which, the transfer magnifying power of the PRE 10 is smaller than one, and therefore, the observation condition of the low magnification can be easily realized. Specifically, for the operator, observation under the low magnification becomes possible without deviation of the optical axis of the lens of the entire electron microscope, and the observation method very easy to use in a user-friendly aspect is provided.

Embodiment 2

Figure 11:
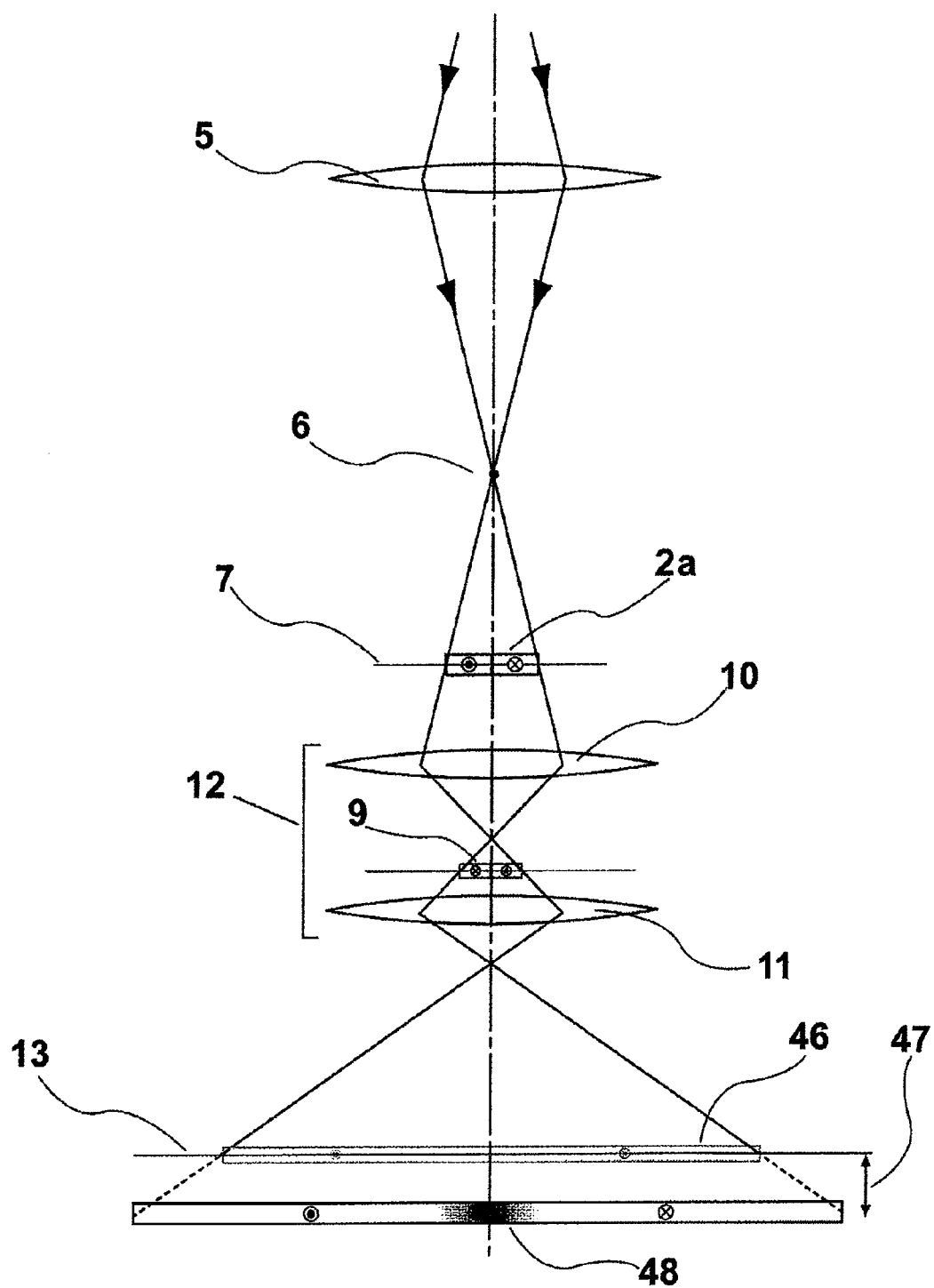
FIG. 11 is a geometrical-optical diagram for explaining an example of application of the present invention to observation of a magnetic specimen.

FIG. 11 shows an example of application of the present invention to observation of a magnetic domain structure of a magnetic material. When only the specimen A 2a of the specimen position 7 outside the objective lens 12 is left on the optical axis and the influence of the lens magnetic field is small enough to be ignored, the magnetic specimen is placed at this position, and can be observed as if the specimen were disposed at the ordinary specimen position 8. FIG. 11 shows a Lorents microscope method for magnetic domain structure observation. The Lorents microscope method is the method for observing the boundary line (magnetic wall) of a magnetic domain as white and black contrast 48 on a surface formed by shifting the screen 13 by a defocus amount 47, since the magnetic information of the specimen cannot be obtained from the normal focus image 46 on the ordinary screen 13.

A similar observation method can be achieved by extremely decreasing an objective lens current. However, in this case, the use condition is in the state with a very small effect of the PRE 10, or with no effect at all, and the optical axes of the lenses from the objective lens 12 significantly deviate. Therefore, the operator has to adjust each lens axis each time the operator changes the lens condition, and the operator is required to have a special adjustment technique. The present embodiment provides an observation method of a magnetic specimen which allows observation with the use method of the objective lens 12 similar to the ordinary use method without requiring the above described special adjustment technique, although the specimen position is actually significantly away from the ordinary case, and is very easy to use in a user-friendly aspect.

Embodiment 3

Figure 12:
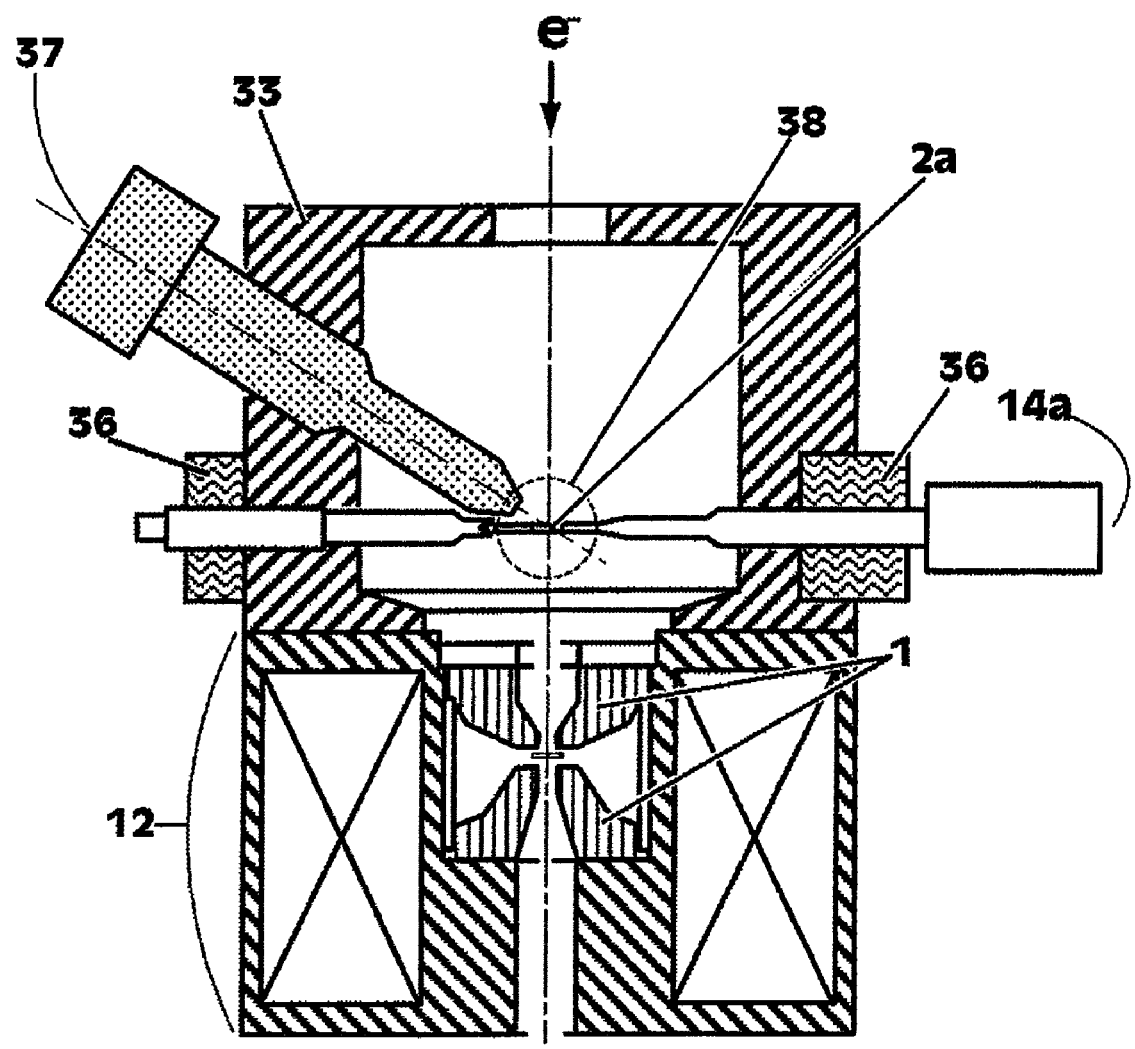
FIG. 12 is a schematic view showing an example in which a space of a specimen chamber is utilized for installation of an X-ray detector.

The present embodiment effectively uses the fact that the space around the specimen placed above the objective lens is not restricted by the objective lens magnetic pole piece. The outline is shown in FIG. 12. In the embodiment, a specimen holder 14a is disposed in a specimen chamber 33 directly above the objective lens 12. Since a device and a mechanism which restrict the space do not exist in the specimen chamber 33, the space can be effectively used. FIG. 12 is an example in which a detector 37 of an X-ray is inserted into the space. The detector has been conventionally inserted in the vicinity of the magnetic pole pieces 1 of the objective lens and has been spatially restricted. Therefore, a capture angle for X-rays cannot be taken large, and there is the disadvantage of having to take a long integral time in order to perform highly accurate analysis from a very small X-ray amount. In the present embodiment, the capture angle can be made large, and the time required for analysis can be reduced. Though not illustrated in FIG. 12, depending on the vacant state of the space, Annular shape X-ray Detector can be also used instead of a conventional cone-shaped X-ray detector, and in such a case, the analysis time can be further reduced. Even when a device inserted into the space is a detector for secondary electrons or reflection electrons, other than the above described X-ray detector, the similar effect can be obtained.

Figure 13:
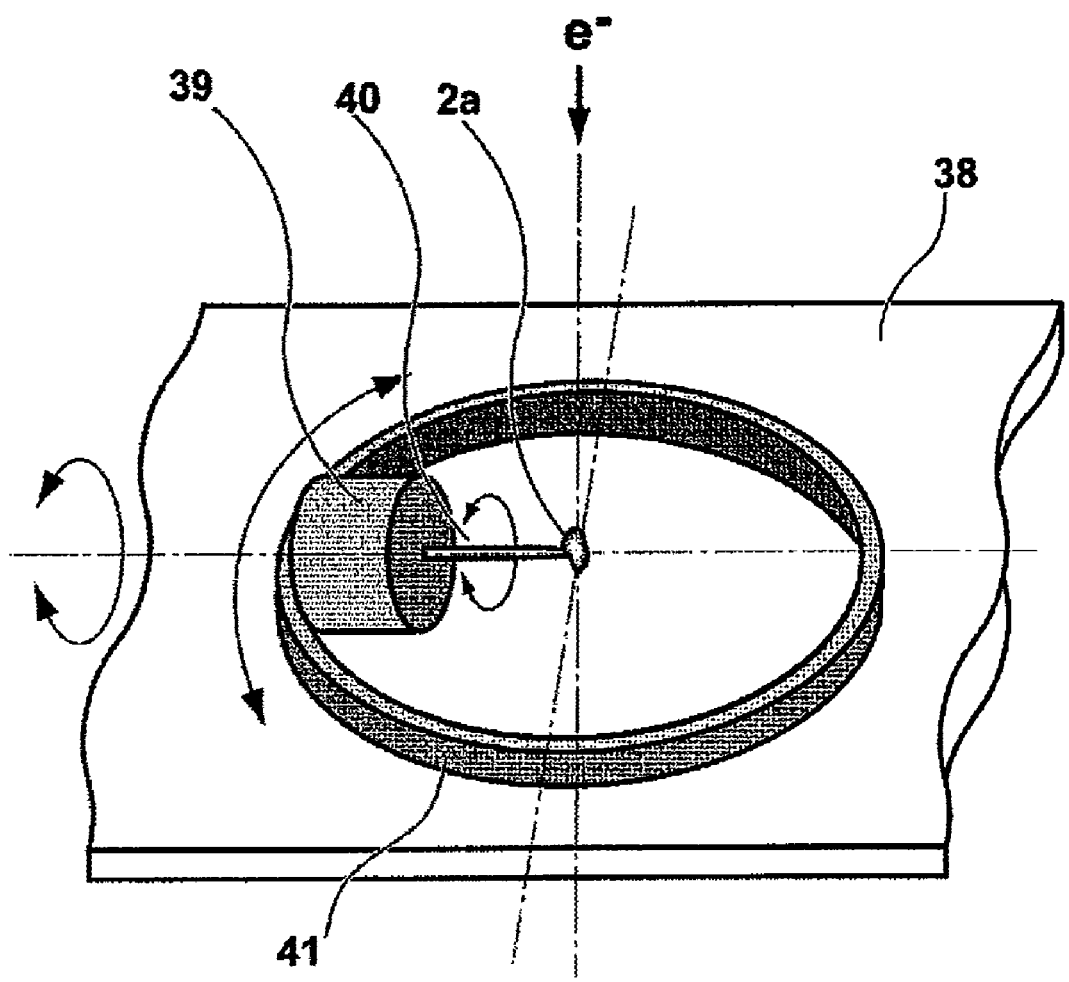
FIG. 13 is a schematic view of an enlarged specimen mounting portion in FIG. 12.

A method for using a space inside the specimen chamber 33 differing from the above description will be described. Even when a specimen is inclined and rotated, spatial restriction is eliminated. FIG. 13 shows an example in which a mechanism rotatable around an axis perpendicular to the optical axis is provided at the specimen holder. FIG. 13 schematically shows a specimen mounting portion 38 of the specimen holder 14a of FIG. 12 by enlarging it. The specimen 2a is fixed to a tip end of a needle 40 by a metal deposition method or the like. The needle 40 is rotatable by a rotary mechanism 39, and further, a base 41 mounted with the needle 40 and the rotary mechanism 39 can be rotated. According to the present invention, there is no spatial restriction. Therefore, the specimen holder 14a can be inclined around the axis, and electron beams can be incident on the specimen 2a fixed to the tip end of the needle 40 from an optional direction. Thereby, the problem of image capture inability angle (missing wedge) in tomography observation using, for example, a TEM can be avoided.

Figure 14:
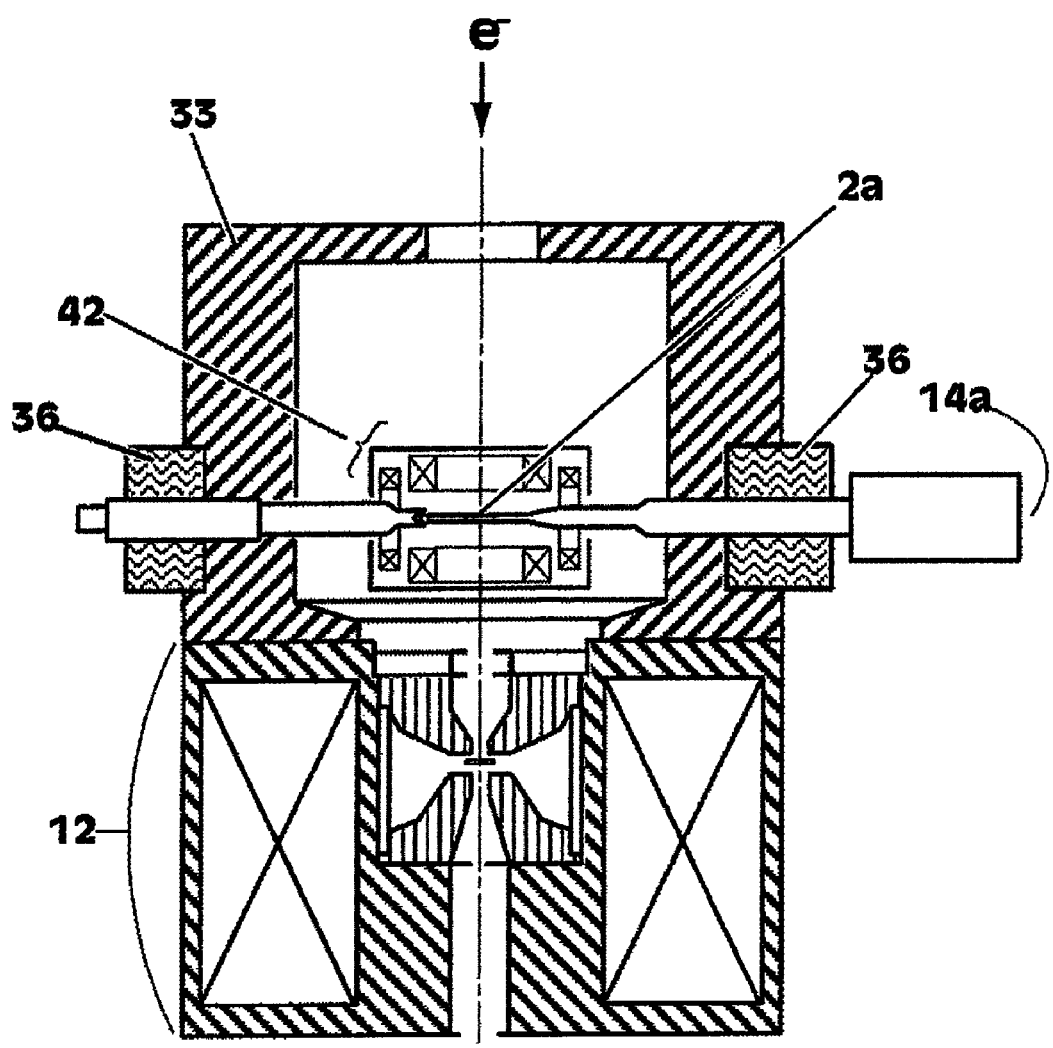
FIG. 14 is a schematic view showing an example in which the space of the specimen chamber is utilized for installation of a magnetic field applying device.

A method for using a space in the specimen chamber 33 differing from the above description will be described. The present embodiment is an example in which a magnetic field applying device for applying an external magnetic field differing from an objective lens to a specimen is provided in the space in the specimen chamber 33. FIG. 14 schematically shows the present embodiment. A magnetic field applying device 42 has three pairs of coils for applying magnetic fields for respective three directions x-Y-z of the specimen 2a. The magnitude and the direction of the external magnetic field which is applied to the specimen 2a are obtained by totaling the magnetic vectors generated by the respective coils. By using this function, interactive action of a magnetic substance and a super conductor by application of the external magnetic field can be observed.

Figure 15:
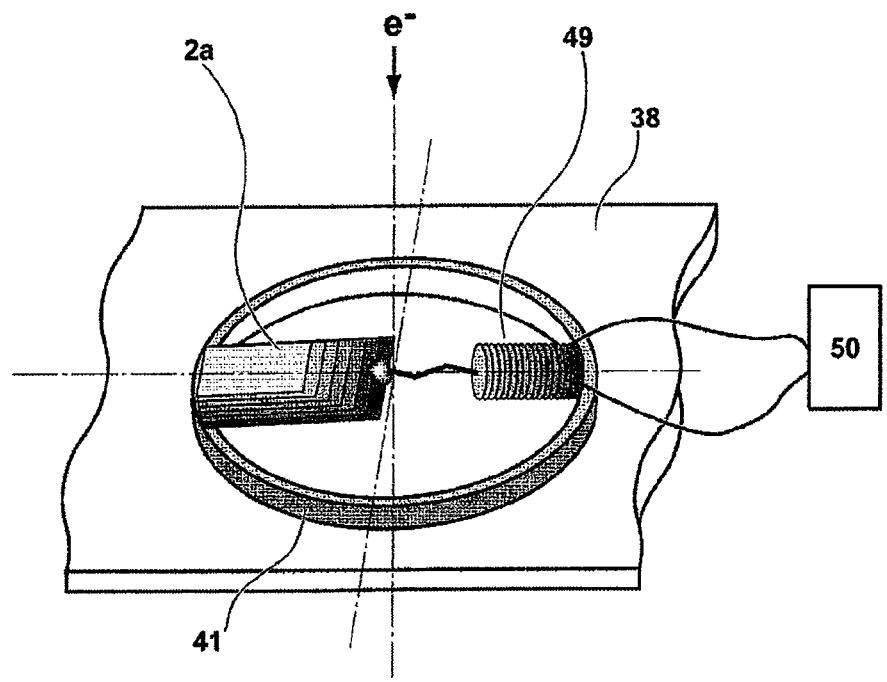
FIG. 15 a schematic view of the case in which a mechanism for applying tension or compression stress to a specimen is provided.

There is an example in which a mechanism capable of applying tension or compression stress to a specimen from outside is provided in addition to the constitution of the above described magnetic field applying device 42. FIG. 15 schematically shows a device constitution for realizing the present embodiment by enlarging the specimen mounting portion 38 of the specimen holder 14a. An end portion of the specimen 2a and a tip end of a piezo element drive mechanism 49 are connected by a rigid body. The piezo element drive mechanism 49 applies internal stress of tension or compression to the specimen 2a by a piezo element drive mechanism control power supply 50 placed outside the device. When the specimen 2a has crystallinity, distortion occurs to the inside of the crystal by change in the internal stress, and as a result, a crystal defect such as dislocation is generated. Application observation experiment of the interaction of such a defect and the magnetic wall can be made.

Figure 16:
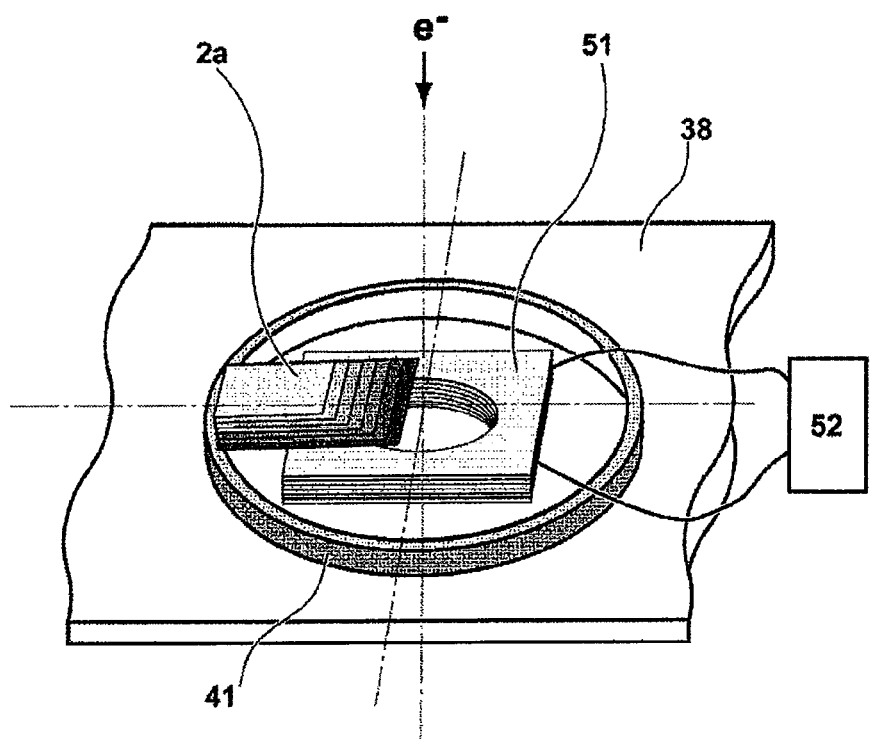
FIG. 16 is a schematic view of the case in which a mechanism for heating or cooling a specimen is provided.

There is an example in which a mechanism for heating or cooling a specimen is provided in addition to the constitution of the above described magnetic field applying device. FIG. 16 schematically shows the constitution of a device for realizing the present embodiment by enlarging the specimen mounting portion 38 of the specimen holder 14a. The specimen 2a is mounted on a variable temperature specimen stand 51. A specimen temperature control device 52 placed outside the device monitors the temperature of the specimen 2a on the variable temperature specimen stand 51 and can control the temperature. Thereby, the transition process of the magnetic characteristic of a substance by change in the specimen temperature can be observed.

Embodiment 4

Figure 17:
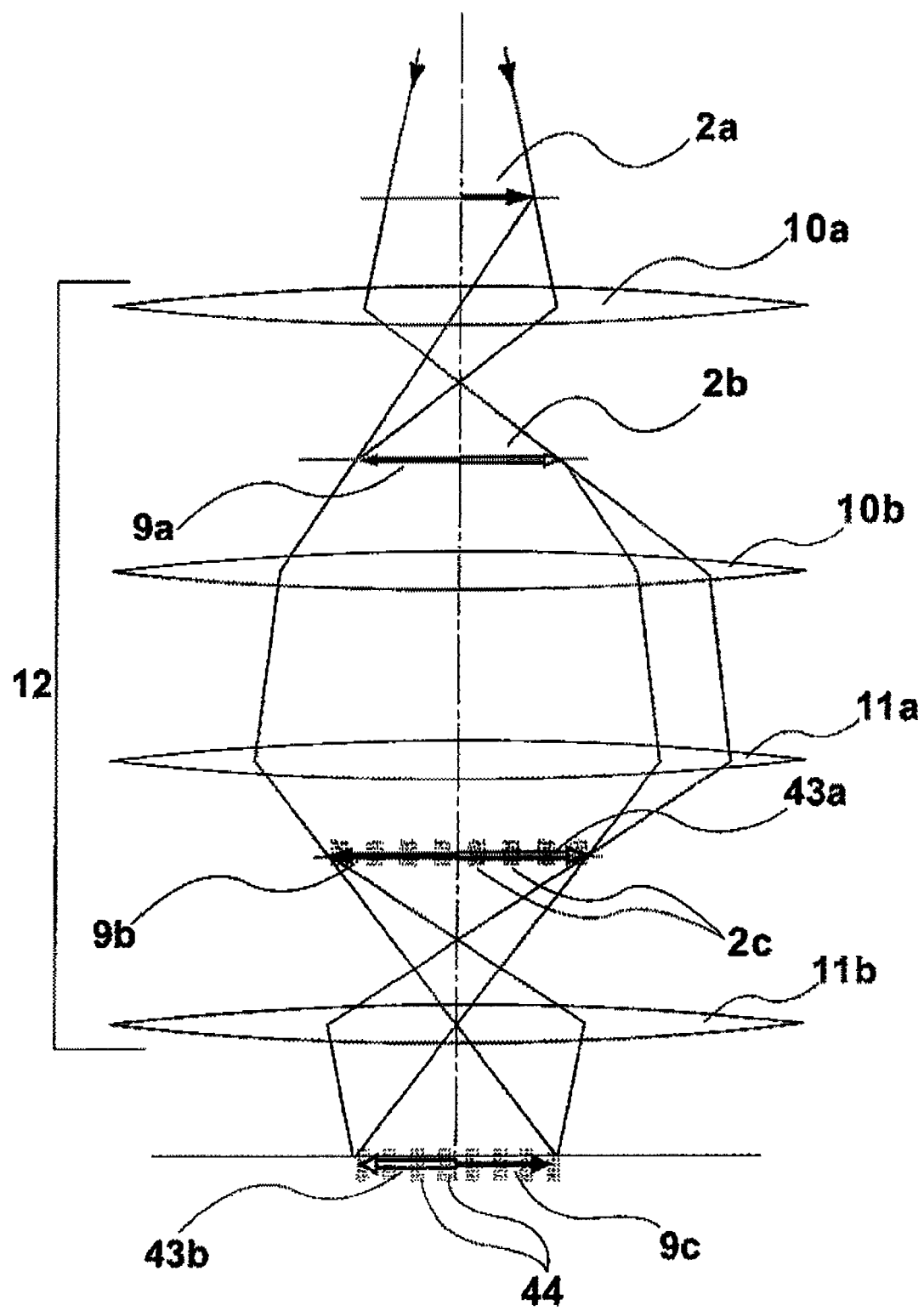
FIG. 17 is a geometrical-optical diagram for explaining the image formation processes of the specimen A, specimen B and specimen C in the case of $k^2=8$.
Figure 18:
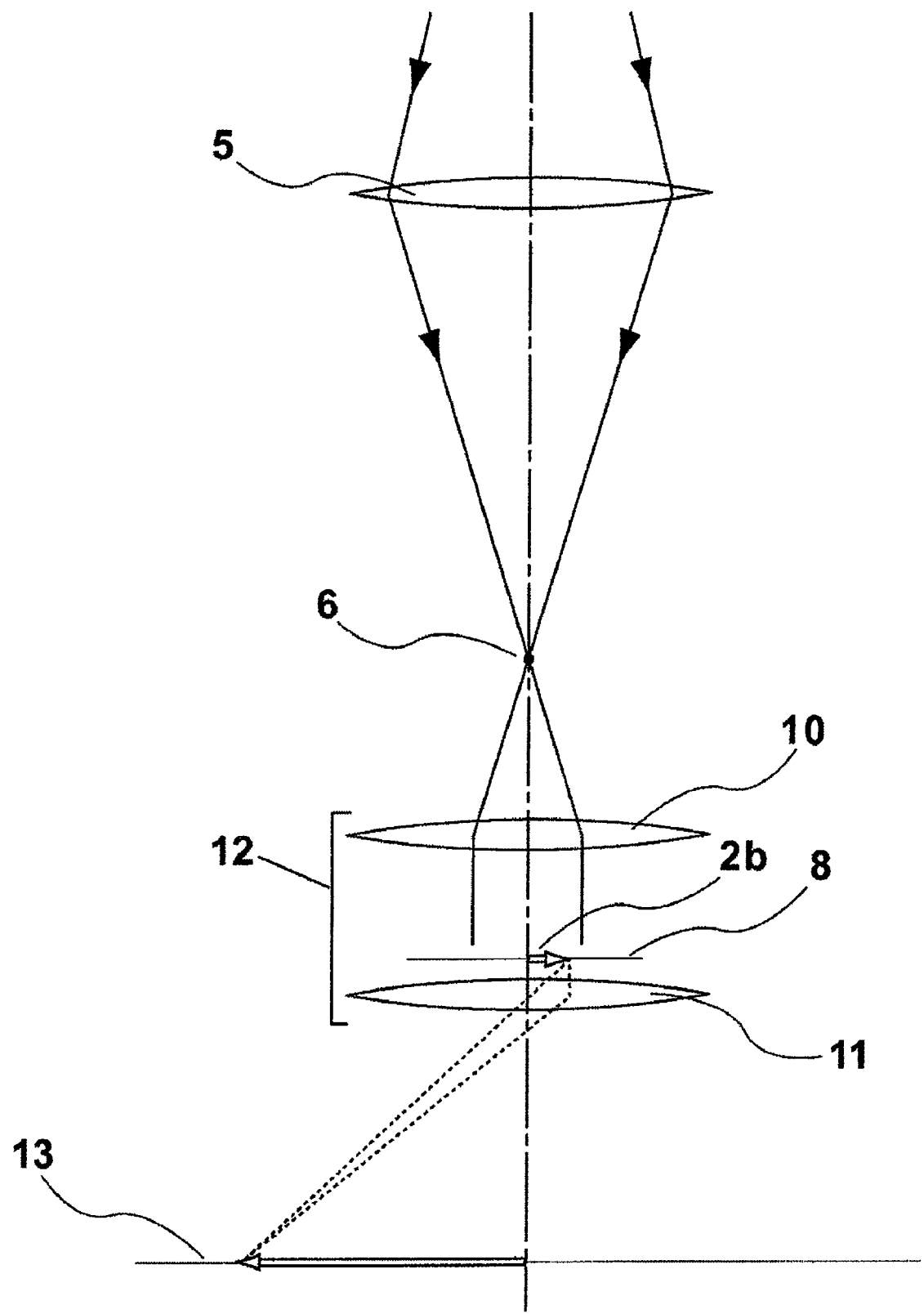
FIG. 18 is a geometrical-optical diagram for explaining the case of forming collimated illumination as an example of a conventional art.

The present embodiment shows an application example of the present invention to the case in which the magnetic field formed in an objective lens becomes as high as a lens constant of $k^2=8$ expressed by formula 3. FIG. 17 shows an electron-optical system in this case.

Figure 3B:
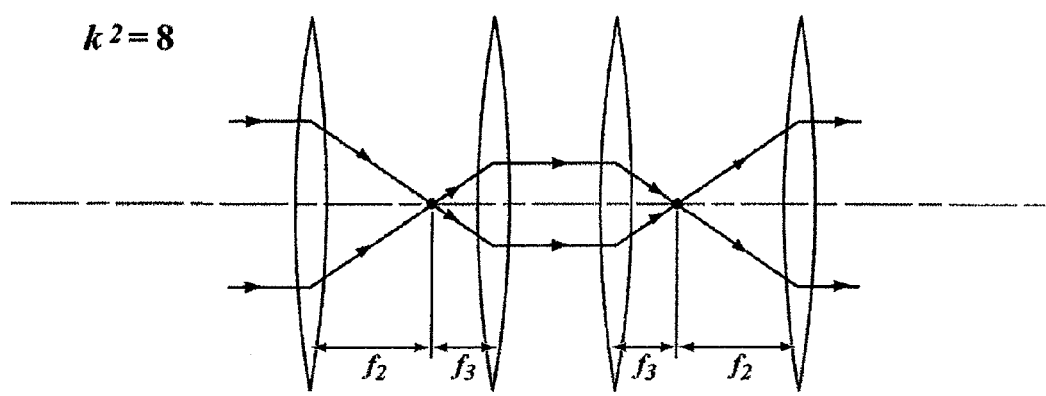
Figure 3C:
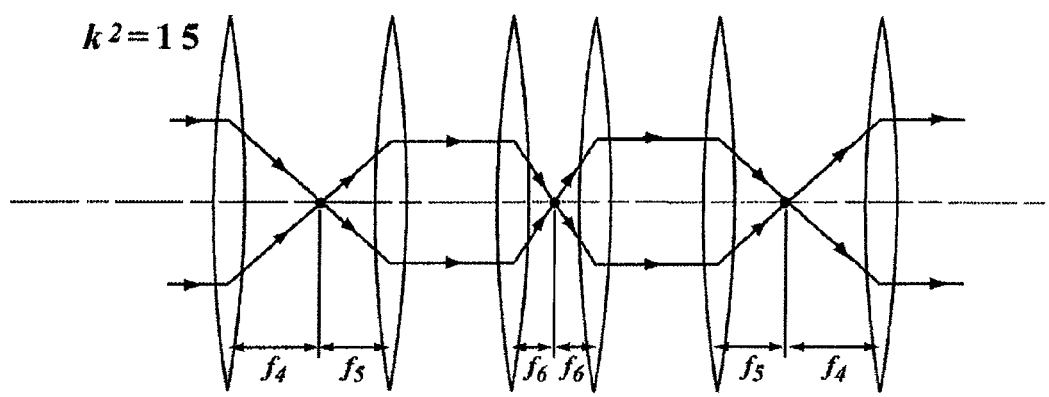

Under the condition, the objective lens functions as four lenses as in FIG. 3B. In FIG. 17, these four lenses are expressed as a first pre-specimen field lens 10a, a second pre-specimen field lens 10b, a first post-specimen field lens 11a and a second post-specimen field lens 11b. A condenser lens upstream from the objective lens 12 is omitted.

In this case, three specimens in total are used, which are the specimen A 2a upstream from the first pre-specimen field lens 10a, the specimen B 2b between the first pre-specimen field lens 10a and the second pre-specimen field lens 10b, and the specimen C 2c between the first post-specimen field lens 11a and the second post-specimen field lens 11b. However, the distance between the specimen B 2b and the specimen C 2c is conceived as extremely short in reality, and therefore, one specimen mounting mechanism for mounting two or more specimens such as, for example, the specimen holder 14b having the front and the back is provided. At this time, it goes without saying that it is effective in practical use if a plurality of mounted specimens can be slightly moved individually.

Scattered waves irradiated to the specimen A 2a, and propagating rearward from the specimen A 2a form a transfer image 9a on the same surface as the specimen B 2b by the first pre-specimen field lens 10a. Further, the scattered waves which propagate rearward from the transfer image 9a of the specimen A 2a and the specimen B 2b pass through the second pre-specimen field lens 10b and the first post-specimen field lens 11a and form the respective transfer images on a specimen C 2c. The scattered waves propagating rearward from a second transfer image 9b of the specimen A 2a, a transfer image 43a of the specimen B 2b and the specimen C 2c form three kinds of images 9c 43b 44 by superimposing them on one another on the screen 13 by the second post-specimen field lens 11b. At this time, if any one of the three kinds of images is the image of the specimen of which size is already known, and the respective relative magnifications of a plurality of specimens inside the objective lens are already known, the sizes of the other two specimens can be relatively measured based on this.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An electron beam observation device comprising:
   a light source of an electron beam;
   an irradiation optical system for irradiating the electron beam emitted from the light source to a specimen;
   an objective lens which comprises an exciting coil, a magnetic yoke and a magnetic pole piece and forms an image of the specimen;
   a lens system for magnifying and observing the specimen image;
   a first port which is disposed at an upstream side in an electron beam traveling direction from the objective lens and for insertion of a first specimen holding device for mounting a specimen on an optical axis of the light source; and
   a second port for insertion of a second specimen holding device for mounting a specimen between the magnetic pole pieces,
   wherein the first specimen holding device and the second specimen holding device are disposed so that an image of a specimen mounted on the first specimen holding device can be formed within a specimen mounting surface of the second specimen holding device so that a magnification becomes ⅟30 to ⅕, by a magnetic field which is at an upstream side in the electron traveling direction from the specimen mounting surface of the second specimen holding device, and is generated by the objective lens.

2. The electron beam observation device according to claim 1, wherein each of the specimens mounted on the first specimen holding device and the second specimen holding device is movable within a surface perpendicular to the optical axis.

3. The electron beam observation device according to claim 1, wherein the first specimen holding device is also used as a diaphragm for suppressing upward scattering of a secondary electron generated by electron beam irradiation to a specimen.

4. The electron beam observation device according to claim 1, wherein the first specimen holding device has a mechanism capable of rotating a mounted specimen around an axis perpendicular to the optical axis.

5. The electron beam observation device according to claim 1, further comprising a magnetic field applying device for applying a magnetic field differing from the objective lens to a specimen mounted on the first specimen holding device.

6. The electron beam observation device according to claim 5, further comprising a mechanism for cooling or heating a specimen mounted on the first specimen holding device.

7. The electron beam observation device according to claim 5, further comprising a mechanism for applying tension or compression stress to a specimen mounted on the first specimen holding device.

8. The electron beam observation device according to claim 1, wherein a distance between a specimen mounting surface of the first specimen holding device and a principle plane of a pre-specimen field lens at an upstream side from the objective lens is 10 mm to 60 mm.

9. An electron beam observation device comprising:
a light source of an electron beam;
an irradiation optical system for irradiating the electron beam emitted from the light source to a specimen;
an objective lens which comprises an exciting coil, a magnetic yoke and a magnetic pole piece, and forms an image of the specimen;
a lens system for magnifying and observing the specimen image;
a first port which is disposed at an upstream side in an electron beam traveling direction from the objective lens and for insertion of a first specimen holding device for mounting a specimen on an optical axis of the light source; and
a second port for insertion of a second specimen holding device for mounting a specimen between the magnetic pole pieces,
wherein a first specimen mounted on the first specimen holding device and a second specimen mounted on the second specimen holding device are mountable on the optical axis, and
in a state of keeping a condition of the objective lens that an image of the second specimen is of a normal focus, an image of the first specimen formed by a magnetic field at an upstream side in the electron beam traveling direction from a specimen mounting surface of the second specimen holding device of the objective lens, and the image of the second specimen are simultaneously observed with a normal focus.

10. The electron beam observation device according to claim 9, wherein each of the specimens mounted on the first specimen holding device and the second specimen holding device is movable within a surface perpendicular to the optical axis.

11. The electron beam observation device according to claim 9, wherein the first specimen holding device is also used as a diaphragm for suppressing upward scattering of a secondary electron generated by electron beam irradiation to a specimen.

12. The electron beam observation device according to claim 9, wherein the first specimen holding device has a mechanism capable of rotating a mounted specimen around an axis perpendicular to the optical axis.

13. The electron beam observation device according to claim 9, further comprising a magnetic field applying device for applying a magnetic field differing from the objective lens to a specimen mounted on the first specimen holding device.

14. The electron beam observation device according to claim 13, comprising a mechanism for cooling or heating a specimen mounted on the first specimen holding device.

15. The electron beam observation device according to claim 13, comprising a mechanism for applying tension or compression stress to a specimen mounted on the first specimen holding device.

16. The electron beam observation device according to claim 9, wherein a distance between a specimen mounting surface of the first specimen holding device and a principle plane of a pre-specimen field lens at an upstream side from the objective lens is 10 mm to 60 mm.

17. A specimen observation method using an electron beam observation device comprising: a light source of an electron beam; an irradiation optical system for irradiating the electron beam emitted from the light source to a specimen; an objective lens which comprises an exciting coil, a magnetic yoke and a magnetic pole piece, and forms an image of the specimen; a lens system for magnifying and observing the specimen image; and a display device for displaying the specimen image,
the specimen observation method, comprising the steps of:
mounting a first specimen including a first pattern, and a second specimen including a second pattern, on an optical axis of the light source;
displaying the first and the second patterns on the display device by forming an image of the first specimen on a surface of the second specimen by a magnetic field which is at an upstream side in an electron beam traveling direction from the second specimen, and is generated by the objective lens; and
measuring a width of one of the patterns by comparing the first and the second patterns.

18. The specimen observation method according to claim 17, further comprising obtaining a relative magnification of the first pattern and the second pattern which are displayed on the display device.

* * * * *